May 19, 1970 O. H. SCHWARTZ 3,513,418

VHF-UHF TELEVISION TUNING SYSTEM

Filed May 31, 1968 4 Sheets-Sheet 1

Inventor
Otto H. Schwartz
By Cornelius J. O'Connor
Attorney

Inventor
Otto H. Schwartz
By Cornelius J. Connor
Attorney

Inventor
Otto H. Schwartz
By Cornelius J. [signature]
Attorney

May 19, 1970 O. H. SCHWARTZ 3,513,418

VHF-UHF TELEVISION TUNING SYSTEM

Filed May 31, 1968 4 Sheets-Sheet 4

Inventor
Otto H. Schwartz
By Cornelius J. Bonnar
Attorney

United States Patent Office 3,513,418
Patented May 19, 1970

3,513,418
VHF-UHF TELEVISION TUNING SYSTEM

Otto H. Schwartz, Glenview, Ill., assignor to Zenith Radio Corporation, Chicago, Ill., a corporation of Delaware Filed May 31, 1968, Ser. No. 733,412
Int. Cl. H03j *1/16, 5/24*
U.S. Cl. 334—1 16 Claims

ABSTRACT OF THE DISCLOSURE

A tuning system for a television receiver has a VHF tuner and for a UHF tuner, each with an incrementally positionable control shaft, and an actuating mechanism for sequentially stepping the control shafts through their tuning ranges. This mechanism includes a pair of geneva wheels each having cam elements assignable to discrete television channels and each having a cut-out portion interposed between two of the cam elements. The geneva wheels, which are individually coupled to assigned ones of the tuner control shafts, are rotatably mounted adjacent an index station for displacement, alternately, from an operative position to a standby position. A driver is supported at the index station to engage the cam element of the operative geneva presented thereto to effect an incremental displacement of the tuner control shaft coupled to that geneva.

This invention relates in general to a tunable television receiver and in particular to a system for tuning the receiver to preselected channels in the VHF and UHF television bands.

BACKGROUND OF THE INVENTION

Tuners for use in the VHF television band invariably employ a discrete type channel selector such as a turret or a band switch arrangement. Characteristically, these tuners include a detent mechanism which is mechanically coupled to the tuner control shaft to provide a positive stop at each of the 12 VHF channels. Discrete type television tuners not only greatly simplify receiver operation by the viewer but they are particularly suitable for use with remote control apparatus.

The UHF television band, on the other hand, embraces 70 channels and thus a turret tuner arrangement is not practical. The industry therefore has resorted to a continuous type tuner for this band. However, in order to facilitate channel selection with such a tuner, present arrangements have been devised which, when coupled to the tuner control shaft, effectively convert the continuous type tuner to a discrete channel selector for desired or available ones of the UHF channels. In practice, such apparatus takes the form of a presettable detent mechanism that locates the UHF tuner control shaft to particular positions corresponding to the desired UHF channels. Convenience dictates that actuation of the VHF and UHF tuner devices be achieved with a single control. Present control arrangements employed to achieve a single or unicontrol actuation of a pair of tuners, however, have been notably complex.

It is, therefore, a general object of the invention to provide an improved VHF-UHF tuning system for a television receiver.

It is a specific object of the invention to provide a VHF-UHF tuning system for achieving discrete channel selection in any portion of the television frequency spectrum.

It is also an object of the invention to provide an improved VHF-UHF tuning system which is readily amenable to manual or remote control operation.

It is also an object of the invention to provide a VHF-UHF tuning system which overcomes the shortcomings of prior art arrangements.

SUMMARY OF INVENTION

A VHF-UHF tuning system for a television receiver constructed in accordance with the invention comprises a VHF tuner which has an incrementally positionable control shaft for tuning the VHF tuner to discrete channels in the VHF band and a UHF tuner likewise having an incrementally positionable control shaft for tuning the UHF tuner to a plurality of predetermined discrete channels in the UHF band. The tuning system includes an actuating mechanism for sequentially stepping the tuner control shafts through their respective tuning ranges, which mechanism comprises a VHF tuner drive unit having a geneva wheel which is coupled to and is displaceable with the VHF tuner control shaft. The geneva wheel has an assigned cam element for each of the VHF channels and a mutilated portion which is interposed between two of the cam elements. The actuating mechanism further includes a UHF tuner drive unit having a geneva wheel which is coupled to and is displaceable with the UHF tuner control shaft. The UHF geneva wheel has an assigned cam element for each of the predetermined UHF channels and also a mutilated portion interposed between two of the cam elements. Means are provided for rotatably mounting each of the geneva wheels adjacent an index station for displacement, alternately, from an operative position in which the cam elements of the wheel are sequentially presented to the index station to a standby position in which the mutilated portion of the wheel in is registration with the index station. A rotatable driving element is supported at the index station and is movable through the mutilated portion of the standby geneva wheel to engage the cam element presented to the index station by the operative geneva wheel in order to effect displacement of the tuner control shaft coupled to the operative wheel. Finally, means responsive to displacement of the operative wheel to the standby position are provided for simultaneously positioning the standby wheel to the operative position.

The features of the invention which are believed to be novel are set forth with particularity in the appended claims. The organization and manner of operation of the invention, together with further objects and advantages thereof, may be best understood by reference to the following description taken in conjunction with the accompanying drawings, in the several figures of which like reference numerals identify like elements and in which:

The present invention concerns itself with a novel tuning system for sequentially actuating a pair of tuners to tune a television receiver to discrete channels in the VHF and UHF television bands. To this end the disclosed embodiment employs a pair of conventional tuners of known construction, therefore they are not extensively detailed either as to structure or mode of operation. Accordingly, attention is addressed principally to so much of the tuning system as is required for practicing the invention.

VHF tuner

Figures 1, 3, 4:
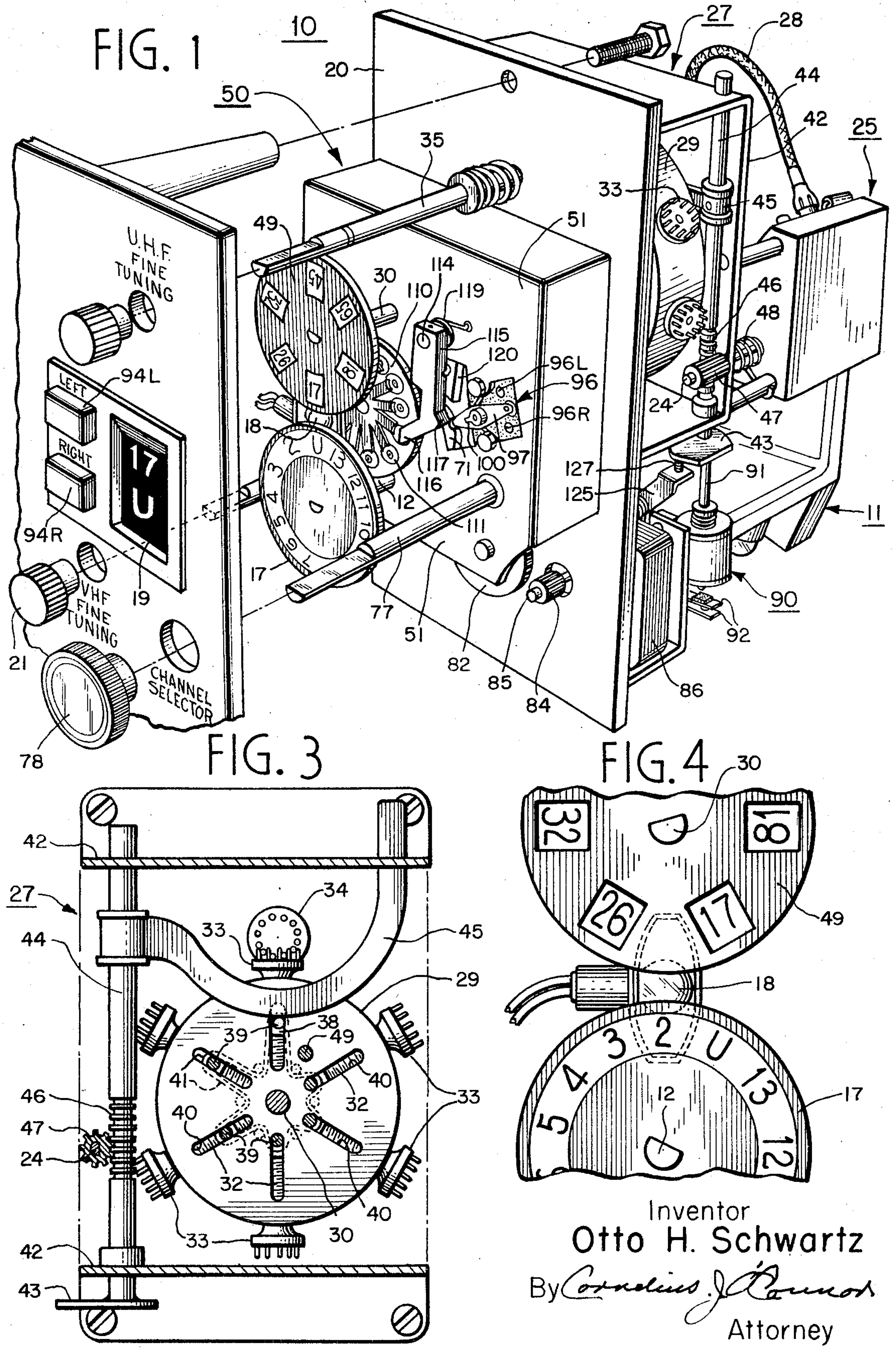
FIG. 1 is a perspective view of a VHF-UHF television tuning system embodying the invention.
FIG. 3 is a sectional view taken along lines 3—3 of FIG. 2 and illustrating the UHF turret mechanism employed in the tuning system of FIGS. 1 and 2.
FIG. 4 is a fragmentary sectional view, taken along lines 4—4 of FIG. 2, illustrating a channel indicating arrangement for the tuning system.
Figure 2:
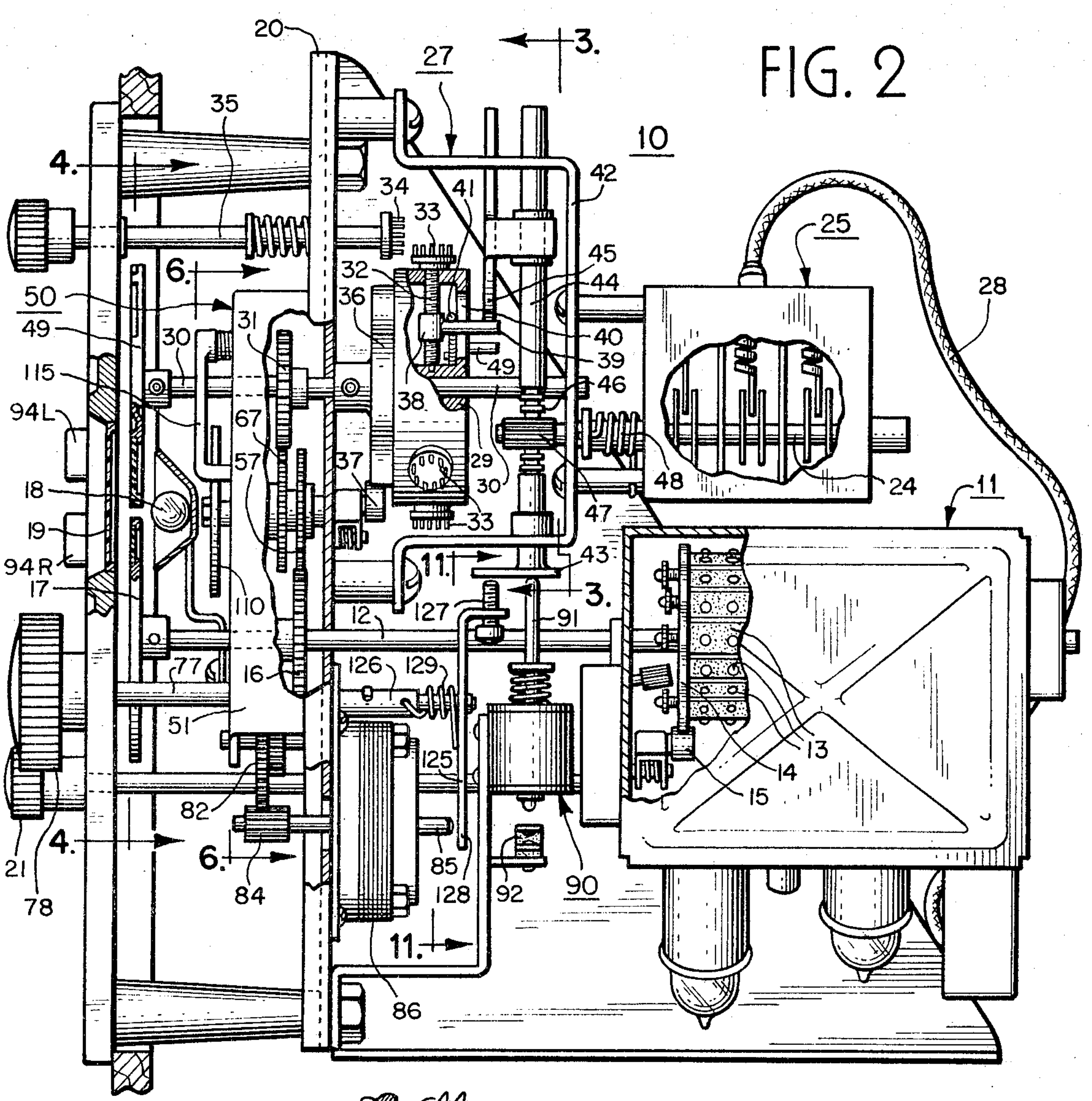
FIG. 2 is a side view, partly broken away, of the tuning system shown in FIG. 1.

Referring now more particularly to FIGS. 1 and 2, a VHF–UHF tuning system 10, which is supported upon a mounting panel 20, comprises a VHF tuner 11, having an incrementally positionable control shaft 12 for tuning it to discrete channels in the VHF band. Specifically, tuner 11 may adopt the construction shown in U.S. Pat. No. 3,144,626 which issued on Aug. 11, 1964 to Otto H. Schwartz and which is assigned to the assignee of the present invention. Tuner 11 includes a series of adjustable tuning strips 13 which are supported in a circular array about the axis of control shaft 12 by a pair of end panels 14 (only one shown) which, in turn, are fixed to the shaft to form a turret tuning device. The periphery of illustrated panel 14 is scalloped to form a plurality of indentations, one for each tuning strip, which cooperate with a detent roller 15 to afford a like plurality of positive incremental stops for the turret thus constituting VHF tuner 11 a discrete channel selector. Supported in this fashion tuning strips 13 are sequentially registered with a conventional stator contact assembly (not shown) to condition the television receiver for operation at the particular channel to which the registered strip is tuned. Such registration is effected through an actuating mechanism 50 which is coupled to tuner 11 by a drive pinion 16 affixed to tuner control shaft 12. The details of mechanism 50, which can be driven manually or by an electric motor, will be considered subsequently. Twelve of the tuning strips are tuned to assigned ones of the VHF television channels while a thirteenth is provided with tuned signal translating circuits for conditioning VHF tuner 11 to function as an amplifier for the output signal of a UHF tuner. A detailed teaching as to how this last mentioned function is readily achieved is found in U.S. Pat. No. 3,290,604 which issued on Dec. 6, 1966 to John F. Bell and which is assigned to the assignee of the present invention. The strips can be individually tuned by a fine tuning control 21 of the type described in the above-mentioned Schwartz patent.

A disc 17, keyed to the forward extremity of control shaft 12 and bearing appropriate translucent indicia, affords visual identification of the operating condition of VHF tuner 11. A lamp 18, disposed immediately behind the upper edge of disc 17, projects the identity of the tuning strip in registration with the stator assembly onto a display window 19 mounted on the front panel or escutcheon of the receiver.

UHF tuner

Tuning system 10 further comprises a UHF tuner 25 having an incrementally positionable control shaft 24 which is stepped by a turret mechanism 27 through a plurality of stops, at each of which tuner 25 responds to a preselected channel in the UHF band. Tuner 25 likewise constitutes a device of known construction, for example, a bank of tunable transmission lines adopting the construction disclosed in copending application Ser. No. 343,281, filed Feb. 7, 1964 in the name of Wayne H. Reynolds and also assigned to the assignee of this invention. Tuner 25 comprises RF preselector and oscillator stages each including a transmission line tunable by a rotatable capacitor electrode. These tuning electrodes are collectively secured to control shaft 24 for conjoint displacement over an angular range required to tune the UHF tuner across the UHF band. Tuner 25 also includes a mixer stage for converting the selected signal to a predetermined IF frequency (40 mc.). This IF signal is coupled via a cable 28 to VHF tuner 11 which, during UHF operation, serves as an amplifier for converted UHF signals in the manner taught in the aforementioned Bell patent.

Turret mechanism 27 effectively converts the continuous type UHF tuner 25 to a discrete channel selector in that it serves to incrementally advance UHF tuner control shaft 24 through a plurality of channel selecting positions in the UHF band, i.e., from one preselected channel to another. To this end turret 27 comprises an indexable drum 29 that is mounted upon a rotatably supported shaft 30 which is connected, via a drive pinion 31, to driving apparatus in actuating mechanism 50, see FIG. 2. Drum 29 is also coupled to UHF tuner control shaft 24 by an arrangement now to be described. More particularly, and as best seen in FIGURES 2 and 3, drum 29 carries a plurality of UHF channel selectors which, in the disclosed embodiment, comprise six radially oriented threaded spindles 32 that are equally spaced about the periphery of drum 29 and rotatably captivated thereon. Each spindle is capped with a gear head 33 that is engageable with the drive gear 34 of a push-to-actuate tuning control 35 when the spindle is presented to a reference position. In effect, the location of control 35 establishes the reference position for the spindles.

The spindles are sequentially indexed to the reference position by a detent mechanism comprising a scalloped disc 36, which is affixed to drum 29, and a spring biased roller 37 that cooperates with the disc in conventional fashion, see FIG. 2. While drum 29 is disclosed as having six channel selecting positions, by virtue of the six spindles 32, detent disc 36 is provided with 12 indentations so that drum 29 has an intermediate position between each channel selecting position. Actually, one such intermediate position is a "Park" or standby position for the turret. A stud 49, which is fixedly secured to drum 29 between two of spindles 32, is associated with this "Park" position. The reason for this arrangement will be explained in a subsequent discussion of the actuating mechanism for the tuning system.

Each of spindles 32 is provided with a cam member 38 that is threaded onto the shank of the spindle. Each cam, in turn, includes a lug 39 that protrudes through a radially disposed slot 40 in an end face of drum 29. An endless serpentine spring 41 passes over each of cam lugs 39 to stabilize them and to counteract backlash. With this construction, therefore, rotational displacement of a spindle effects a radial displacement of its associated cam and lug.

Postioned adjacent the array of cam lugs 39 is a vertically displaceable rack 44 having a flange 43 secured to one end thereof. Rack 44 is slidably captivated within openings in the top and bottom walls of a U-shaped bracket 42. Rack 44 has a cam follower 45 extending therefrom and disposed in the path of the cam lug occupying the reference position. The lower extremity of rack 44 comprises a gear section 46 which meshes with a pinion 47 affixed to the end of UHF tuner control shaft 24. Control shaft 24 is loaded by a spring 48 that imparts a biasing force thereto which force, in turn, is transmitted back to cam follower 45, via rack 44, to urge follower 45 against the indexed one of cam lugs 39, or against stud 49, if it occupies the reference position. In this fashion the position of tuner shaft 24, which, of course, determines the operating frequency of UHF tuner 25, is controlled by the indexed cam lug. The length of the spindles 32 and the travel permitted cam lugs 39 and rack 44 is more than sufficient to enable tuning control 35 to drive UHF tuner shaft 24 through its entire tuning range. With this construction, therefore, each spindle is adjustable to select any channel in the UHF band.

To provide identification of the selected UHF channel the forward extremity of turrent shaft 30 is fitted with a disc 49 having six apertures each of which accommodates a replaceable indicia bearing transparency. The disc is positioned in front of lamp 18 so that the channnel number of the selected UHF station is cast upon window 19. Referring to FIG. 1, therefore, the "17" displayed in window 19 signifies that turret 27 has positioned control shaft 24 of UHF tuner 25 to select channel "17" while the U indicates that the tuning strip for conditioning VHF tuner 11 to function as an amplifier for the IF output signal of UHF tuner is positioned to control the VHF tuner. The display depicted in FIG. 4, on the other hand, signifies that the VHF channel 2 tuning strip is controlling the operation of tuner 11. Note, in this situation, that UHF indicator disc 49 does not present a transparency to lamp 18 but is "Parked" between two of its transparencies.

Tuner actuating mechanism

The VHF tuner and the UHF tuner are controlled by an actuating mechanism 50 that sequentially steps respective tuner control shafts 12 and 24, the latter through the agency of turret 27, through their tuning ranges. Actuator 50, which is mounted within a housing 51, comprises a VHF tuner drive unit that includes a geneva wheel 52 having a plurality of radially oriented teeth 53, see FIG. 5A. These teeth constitute cam surfaces and they are interconnected by a series of relieved portions or slots 54 and a mutilated or cut-out portion 55 so as to collectively form a continuous undulating cam surface about the periphery of wheel 52. There are twelve teeth, one for each of the VHF channels. Preferably, each of the teeth is of the same size and configuration and, with the exception of the two bordering cut-out 55, the teeth are equally spaced. The expanse of cut-out 55 approximates that of a tooth 53 plus two of flanking slots 54. Thus the angular spacing between adjacent teeth, as well as slots 54, is approximately 27.7°, specifically, 360°/13=27.69°. Geneva wheel 52, therefore, can be characterized as a thirteen position device in that each of its twelve teeth is assignable to a particular VHF channel while cut-out 55 serves to establish the geneva, as well as the VHF tuner, in a stand-by position.

Means are provided for rotatably mounting geneva wheel 52 adjacent an index station for displacement from an operative position in which cam teeth 53 are sequentially presented to the index station to a stand-by position in which cut-out 55 is in registration with the index station. Specifically, wheel 52 is staked or otherwise secured to one end of a drive shaft 56 that is rotatably supported between mounting panel 20 and the front wall of housing 51 so that cam teeth 53 and cut-out 55 are sequentially presentable to a driver means 70, see FIG. 6. In effect, driver means 70 constitutes the aforementioned index station. The other end of shaft 56 is fitted with a driving gear 57 that mates with the pinion 16 fixed to VHF tuner control shaft 12 so as to couple geneva 52 to tuner shaft 12. A wedge-shaped ear or abutment 58 projects from the side of drive gear 57 that faces the geneva wheel. Abutment 58 has an arcuate width of approximately 27.7° which is the angular distance traveled by geneva wheel 52 when rotated from one of its thirteen positions to the next. If desired shaft 56, gear 57, and abutment 58 may be molded or cast as an integral piece.

Figure 5A:
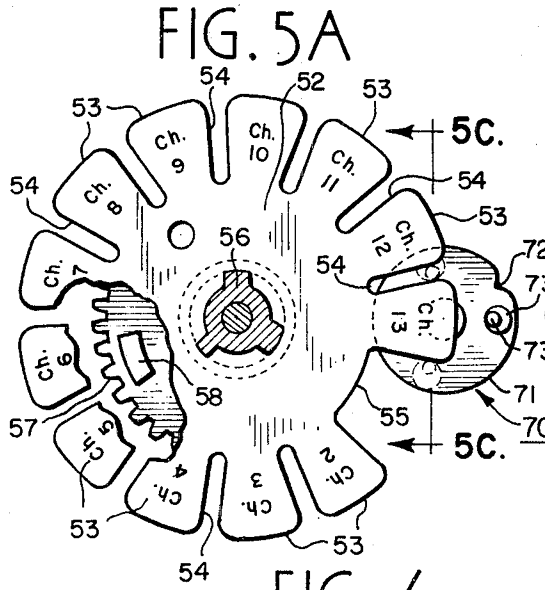
FIG. 5A is an elevational view, partly broken away of the VHF geneva wheel.
Figure 5B:
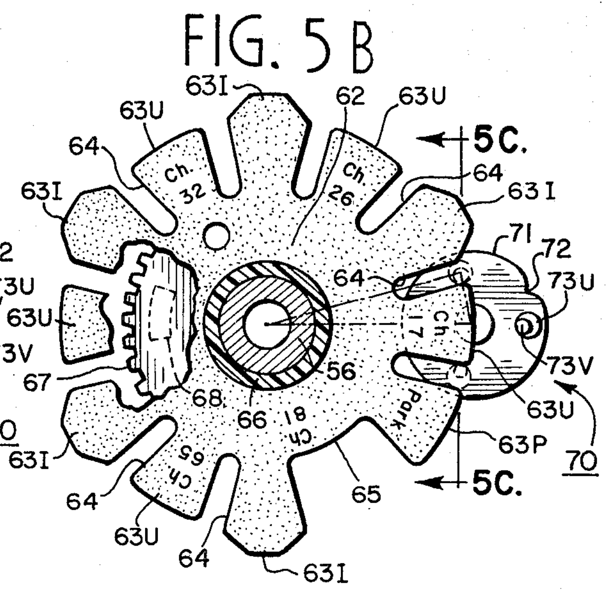
FIG. 5B is an elevational view, partly broken away, of a UHF geneva wheel.

Actuating mechanism 50 further includes a UHF tuner drive unit comprising a geneva wheel 62 functionally associated with VHF turret 29 and having two groups of radially disposed teeth, see FIG. 5B. The five teeth of one group are designated 63I since they are associated with the intermediate positions of turret 29. The other group comprises six teeth, five of which are labeled 63U in deference to their role in selecting a UHF station, while one tooth is designated 63P since it serves to establish geneva 62 and turret 29 in a "Park" position. The teeth are interconnected by a series of relieved portions or slots 64 and a cut-out portion 65 so that a continuous undulating cam surface is established about the periphery of geneva 62. Cam teeth 63I differ from the cam teeth 63U, 63P principally in that each of the 63I teeth comprises a radially extending crown portion. In other respects the two groups of teeth are identical and, except for the two teeth bounding cut-out 65, the teeth are equally spaced. In this geneva wheel, also, the arcuate expanse of cut-out portion 65 approximates that of one of the teeth plus two of the flanking slots 64.

By virtue of its particular construction geneva wheel 62 constitutes a twelve position device in that each of the eleven teeth 63U, 63I, 63P plus cut-out 65, is available for a different assignment. Actually the role of selecting the sixth UHF channel is assigned to a portion of cut-out 65, as will be shown below. The angular spacing, therefore, between adjacent teeth, as well as between adjacent slots 64, of this twelve position geneva is 30°, specifically, 360°/12=30°. A diameter of geneva 62 is approximately the same as that of VHF geneva 52, that is, the diameter of a circle circumscribing the crowns of UHF cam teeth 63I is substantially the same as the diameter of a circle circumscribing the apices of VHF cam teeth 53.

Figure 7:
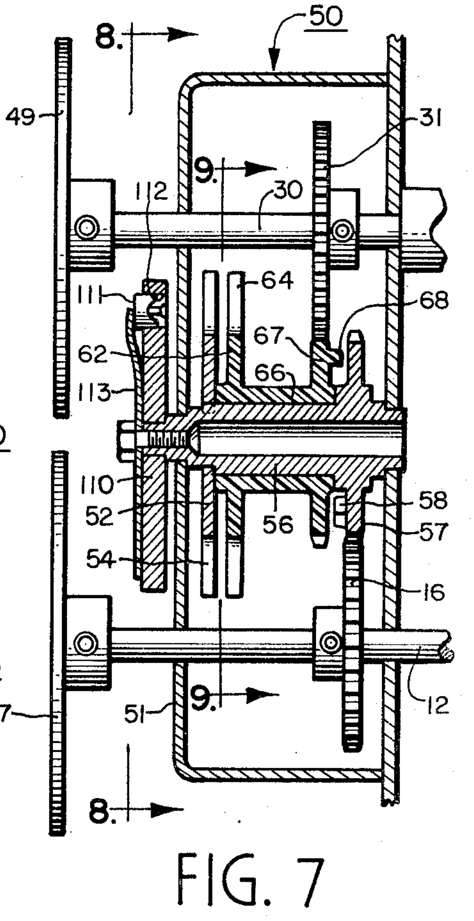
FIG. 7 is a side view, partly broken away, of the apparatus shown in FIG. 6.

As best seen in FIG. 7, UHF geneva wheel 62 is fixed to one end of a hollow drive shaft 66 while a driving gear 67, which meshes with pinion 31 on UHF turret shaft 30, is secured to the other end of shaft 66. In this fashion geneva 62 is coupled to the UHF tuner. A wedge-shaped abutment 68 projects outwardly from that side of gear 67 that faces away from geneva 62. Abutment 68 has an arcuate width of about 27.7°, the same as VHF abutment 58. Wheel 62, shaft 66, gear 67 and abutment 68 may also be formed as an integral molded piece.

Means are also provided for rotatably mounting geneva wheel 62 adjacent an index station for displacement from an opeartive position to a standby position. To this end drive shaft 66 is coaxially mounted upon VHF drive shaft 56 and captivated between geneva wheel 52 and a bearing shoulder on VHF driving gear 57 so that drive gears 57, 67, as well as geneva wheels 52, 62, are rotatably supported in closely spaced parallel planes in the manner shown in FIG. 7. Thus mounted geneva wheels 52, 62 are displaceable, alternately, from an operative position, in which the cam teeth of the operative wheel are sequentialy presented to driver means 70, to a stand-by position in which the cut-out portion of the wheel is presented to driver 70.

As is apparent in FIG. 7, each of gear abutments 58, 68 extends into the rotational path of the other thus restricting drive gears 57, 67 to an angular displacement, relative to each other, to less than 360°. Upon engagement then, and in a manner explained below, abutments 58, 68 collectively serve to displace the operative one of the geneva wheels to the stand-by position and, at the same time, to transfer the stand-by wheel to the operative position.

Figure 6:
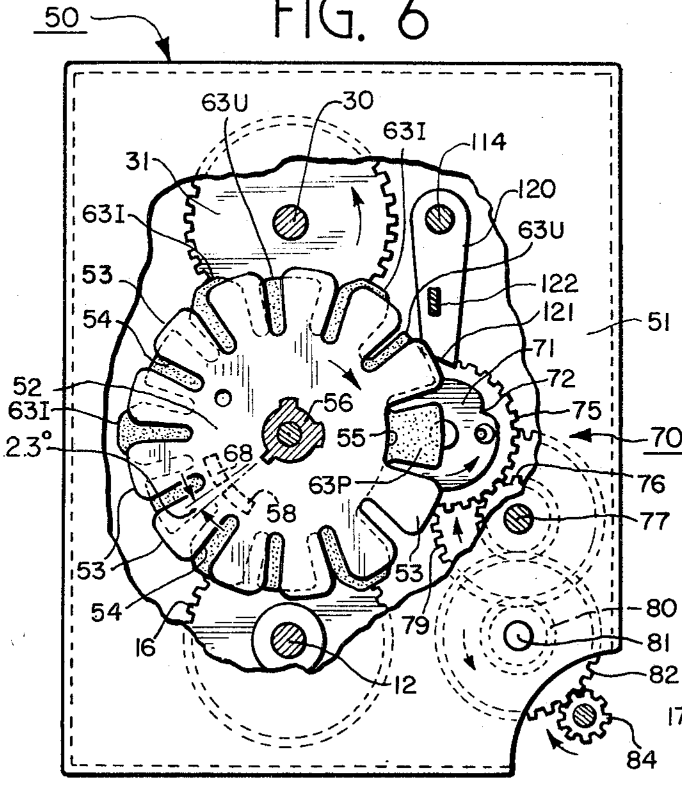
FIG. 6 is an elevational view, partly broken away, of a portion of the tuning system taken along lines 6—6 of FIG. 2.
Figure 5C:
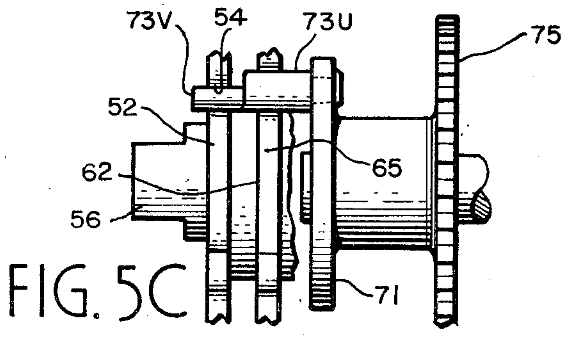
FIG. 5C is a composite of two sectional views taken along lines 5C—5C of FIGS. 5A and 5B and illustrating the manner in which the VHF and UHF geneva wheels are driven.

Geneva wheels 52, 62 of actuating mechanism 50 are sequentially driven by driver means 70 which comprises a driving element 71 which is journalled upon mounting panel 20 for rotation about an axis parallel to that of drive shafts 56, 66 but radially displaced therefrom, see FIGS. 5A–6. Driving element 71, which includes a peripheral notch portion 72, is fitted with a drive pin that is eccentrically mounted thereon for engagement with geneva cam slots 54, 64. However, since the cam slots on the UHF geneva are angularly displaced by 30° while the slots on the VHF geneva are spaced 27.7°, the drive pin is provided with a pair of drive sections that traverse different orbital paths. To this end the drive pin comprises a base section 73U and an offset upper section 73V, see FIG. 5C. As illustrated in FIG. 5A, the axis of pin section73V is spaced from the center of element 71 by a distance that is substantially equal to the perpendicular distance from the point where the center line of an indexed one of teeth 53 intersects the rotational center of driving element 71 to the center line of the adjacent geneva slot 54. In like fashion, and as shown in FIG. 5B, the axis of drive pin section 73U is spaced from the center of element 71 by a distance that is substantially equal to the perpendicular distance from the point where the center line of an indexed one of teeth 63U, 63I, or 63P intersects the rotational center of element 71 to the center line of the adjacent geneva slot 64.

Mounted in this fashion drive pin sections 73V, 73U travel concentric orbital paths through the gap portions 55, 65, respectively of geneva wheels 52, 62 when their associated wheel is in the stand-by position but selectively engage the cam elements presented by their associated wheel when it is in the operative position so that, upon successive complete rotations of driving element 71, a step-by-step rotation of the operative geneva is effected.

Driver means 70 is actuatable manually or by an electric motor which can be energized at the receiver or from a remote location. In either case, see FIG. 6, driving element 71 is provided with a gear portion 75 that cooperates with a gear train comprising a pinion 76 that is affixed to a control shaft 77 which, in turn, is rotatably supported between mounting panel 20 and the front wall of housing 51. An extension of shaft 77, which is terminated by a knob 78, constitutes the manual control depicted in FIGS. 1 and 2. A second pinion 79, also secured to shaft 77, meshes with an idler gear 80 which is secured to an idler shaft 81. Shaft 81 is also rotatably supported between panel 20 and housing 51. Finally, the gear train includes an additional idler gear 82 which is mounted for rotation with idler shaft 81 and is engageable with a pinion 84 secured to one end of the armature 85 of a bi-directional motor 86. Armature 85 is axially displaceable from an inoperative position, as shown in FIG. 1, to the operative position depicted in FIG. 2 upon energization of the motor field windings.

Motor control circuit

Figures 8, 8A, 9, 10:
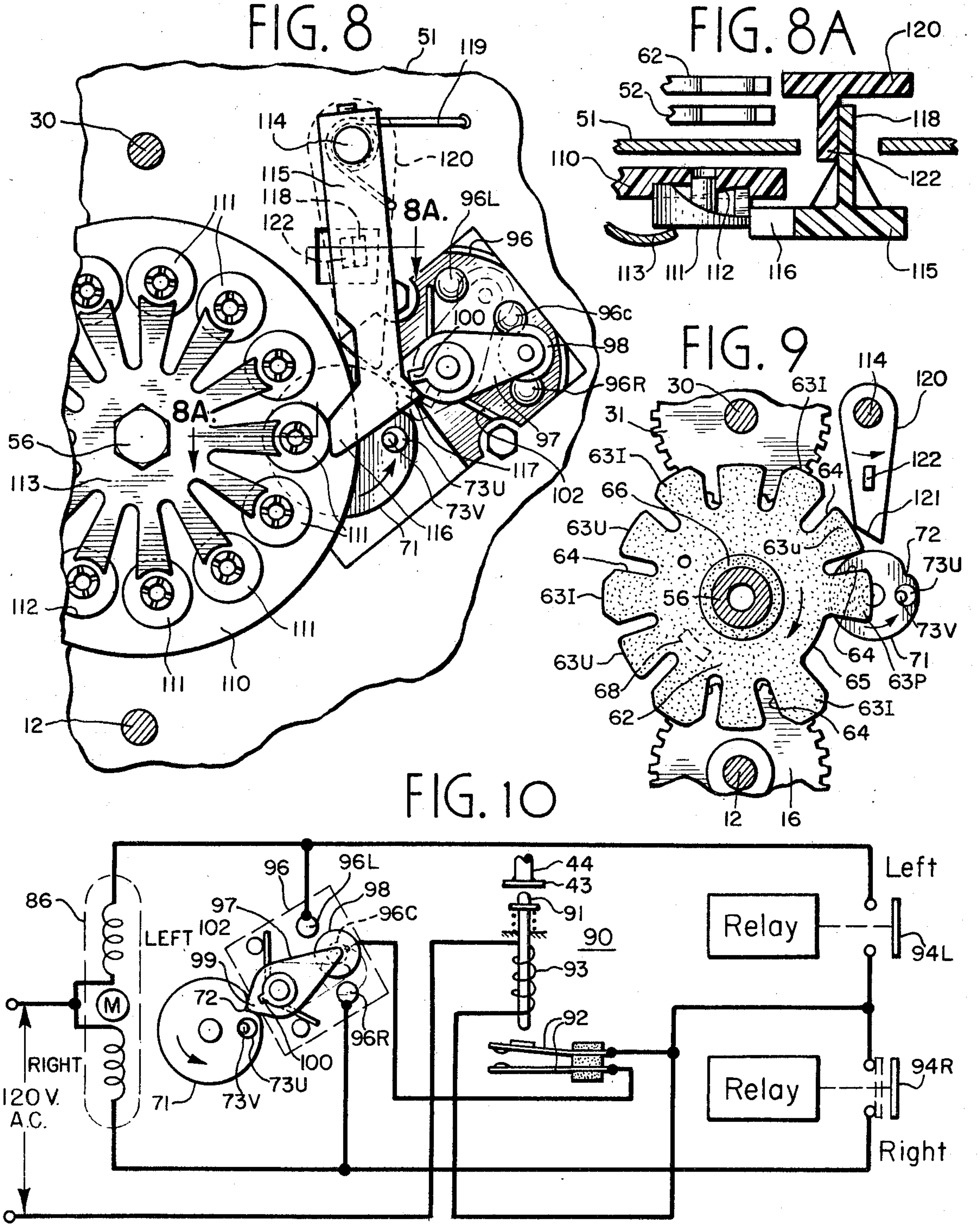
FIG. 8 is a sectional view taken along lines 8—8 of FIG. 7.
FIG. 8A is a sectional view taken along lines 8A—8A of FIG. 8.
FIG. 9 is a sectional view taken along lines 9—9 of FIG. 7.
FIG. 10 is a schematic representation of an energizing circuit for a drive motor.

As best seen in FIG. 10, the field windings of motor 86 are energized from a 120 volt source of alternating current through a control circuit that includes a holding relay 90 having a spring loaded displaceable actuator 91, a pair of normally open contacts 92 and an energizing coil 93. Relay 90 is mounted under UHF turret 27 with its contact actuating plunger 91 positioned beneath flange 43 of rack 44, see FIGS. 2 and 11. The energizing winding 93 and the contacts 92 of relay 90 are serially connected in circuit with one of the source leads. The relay contacts 92 are by-passed by the switches 94L, 94R which, when closed, selectively connect oppositely wound field windings of motor 86 across the AC source to drive the motor in left or right directions, respectively. Switches 94L, 94R may be closed manually or by a pair of relays which, in turn, can be actuated by a remote control system of the type shown and described in Pat. 2,817,025 which issued to Robert Adler on Dec. 17, 1957 and is assigned to the same assignee as the present invention.

The control circuit for motor 86 further includes a single-pole, double-throw carryover switch 96 which is mounted inside actuator housing 51 and comprises three fixed contacts designated 96L, 96R and 96C. Contact 96L is connected through one field winding of motor 86 to one terminal of the 120 volt source while contact 96R is returned through the oppositely wound motor field winding to the same source terminal. Contact 96C, on the other hand, is returned through relay contacts 92 and relay energizing coil 93 to the other terminal of the 120 volt source.

Switch 96 also includes a toggle 97 which is pivotally mounted adjacent driving element 71. One end of toggle 97 is fitted with a contact 98 of sufficient dimension to conductively bridge fixed contact 96C with either of flanking contacts 96L or 96R, see FIG. 8. The other end of toggle 97 is terminated by a tongue 99 that bears against driving element 71. A pedestal 100 is formed atop toggle 97 to cooperate with a programming arrangement subsequently to be described.

By virtue of its pivotal mount toggle 97 and contact 98 are displaceable from a normally open position, in which contact 98 engages only fixed contact 96C, to either of two operating positions. In one such operating position toggle 97 is pivoted so that contact 98 effects a conductive engagement between fixed contacts 96C and 96L while in the other position contact 98 bridges contacts 96C and 96R. When driving element 71 is in its quiescent or rest position, as depicted in FIG. 10, a centering spring 102 serves to maintain switch 96 normally open by returning the toggle to a neutral position in which its tongue 99 seats in notch 72 of driving element 71 and its contact 98 engages fixed contact 96C.

Programming arrangement

It is appreciated that not all the VHF stations, nor even six different UHF stations, may be available at the particular site where a television receiver employing the subject tuning system is located. Therefore, in order to facilitate selecting the available channels in each band, particularly in the situation where a drive motor arrangement is employed, the tuning system is provided with a programming mechanism. The mechanism for selecting VHF stations comprises a programming disc 110 which is mounted on the end of VHF control shaft 56, see FIGS. 7 and 8. A plurality of buttons 111, one for each of the thirteen operating positions of geneva 52, are rotatably seated within a like plurality of receptacles 112 formed about the periphery of disc 110. A button, therefore, is assigned to geneva gap portion 55, as well as to each of the twelve Geneva cam teeth 53. The buttons are retained within their receptacles by a multi-finger spider 113. The interior of receptacles 112 and the walls of buttons 111 are provided with stepped cam surfaces that cooperate to position the buttons in either an extended or a retracted position, relative to the surface of disc 110, see FIG. 8A, thus constituting the buttons bi-stable two-position devices. The exposed faces of the buttons are slotted, or otherwise mutilated, to accommodate a tool for rotating the buttons from the retracted to the extended position and vice versa.

A cam lever 115 is mounted on a shaft 114 which is rotatably supported by the front and rear walls of housing 51. Lever 115 has a depending foot section 116 which is disposed adjacent the program button occupying the index station, see FIG. 8. The lever also includes a heel portion 117 that confronts pedestal 100 atop switch toggle 97 and, as best seen in FIG. 8A, a post 118 which is affixed to the back of the lever and extends rearwardly toward housing 51. A spring 119 maintains a constant bias on lever 115 to urge it in a clockwise direction, as viewed in FIG. 8. By virtue of this spring force and the cooperation of program buttons 111, cam lever 115 is displaceable from a first or quiescent position to a second or actuated position. In its first position, which is depicted in FIG. 1, foot 116 of cam 115 overlies a retracted button so that its heel 117 is withdrawn from pedestal 100 thus permitting switch toggle 97 to return to its neutral position. In its second position, which is illustrated in FIGS. 8 and 8A and to which it is driven by an extended one of buttons 111, heel 117 engages pedestal 100 to hold carryover switch 96 closed, that is, to maintain toggle contact 98 in engagement with switch contacts 96C and 96R, in this instance.

Insofar as the selection of UHF stations is concerned, the UHF geneva wheel 62, by virtue of the configuration of its cam teeth 63I, 63U, 63P in cooperation with a cam arm 120, comprises a UHF programmer. Arm 120 is mounted upon the same shaft 114 as VHF cam lever 115, but within housing 51, and is also subjected to the bias of spring 119, see FIGS. 6 and 9. Arm 120 is provided with a depending cam shoe 121 which is urged against the UHF cam tooth occupying the index station. Arm 120 includes a finger 122 which extends forwardly through an opening in the front wall of housing 51 to bear against post 118 of VHF cam lever 115 as shown in FIG. 8A.

Cam arm 120 is also displaceable from a first or quiescent position in which its shoe portion 121 rests against one of UHF cam teeth 63U to a second or actuated position against one of teeth 63I. When cam shoe 121 engages one of teeth 63I cam arm 120 is pivoted counterclockwise to its actuated position and this displacement of arm 120 is coupled to cam lever 115 via finger 122 and post 118. This movement of lever 115 serves to drive its heel 117 against toggle pedestal 100 to hold carryover switch 96 closed and maintain the motor drive circuit energized. Thereafter when tooth 63I is replaced by one of teeth 63U, 63P or by gap 65, cam arm 120 is restored to its first position by spring 119 and toggle 97 can return to its off position.

A study of FIG. 9 reveals that any of cam teeth 63U, 63P as well as cut-out 65 is geneva wheel 62, enables cam arm 120 to assume its first position to permit the carryover switch to open, while any of the five crowned cam teeth 63I displaces arm 120 to its second or actuated position in which it maintains the contacts of the carryover switch closed. Geneva 62 and cam arm 120 thus constitute a programmer to the extent that they exercise control over the carryover switch depending upon the particular cam tooth presented to the index station. However, in view of the fact that there may be less than six UHF stations within range of the tuning system, means are required for preventing de-energization of the motor control circuit when a particular one, or ones, of cam teeth 63U encounter cam arm 120.

Accordingly, in order to defeat the normal function of a cam tooth 63U and thus insure that the motor control circuit remains energized in spite of the presence of a 63U tooth at the index station, two conditions must be fulfilled. First, pinion 84 on motor armature 85, which normally disengages from gear train idler 82 when carryover switch 96 opens the motor energizing circuits, must be kept engaged. This engagement must be maintained so that when, the motor is de-energized, the inertia of the motor armature can drive element 71 beyond its quiescent position. Element 71 then will carry switch toggle 97 past its off position to an on position to reclose the motor energizing circuit. Secondly, relay contacts 92 must be held closed mechanically until carryover switch 96 is reclosed. This is necessary because relay 90 will release contacts 92 when toggle 97 opens the circuit to the energizing coil 93 of the relay.

Figure 11:
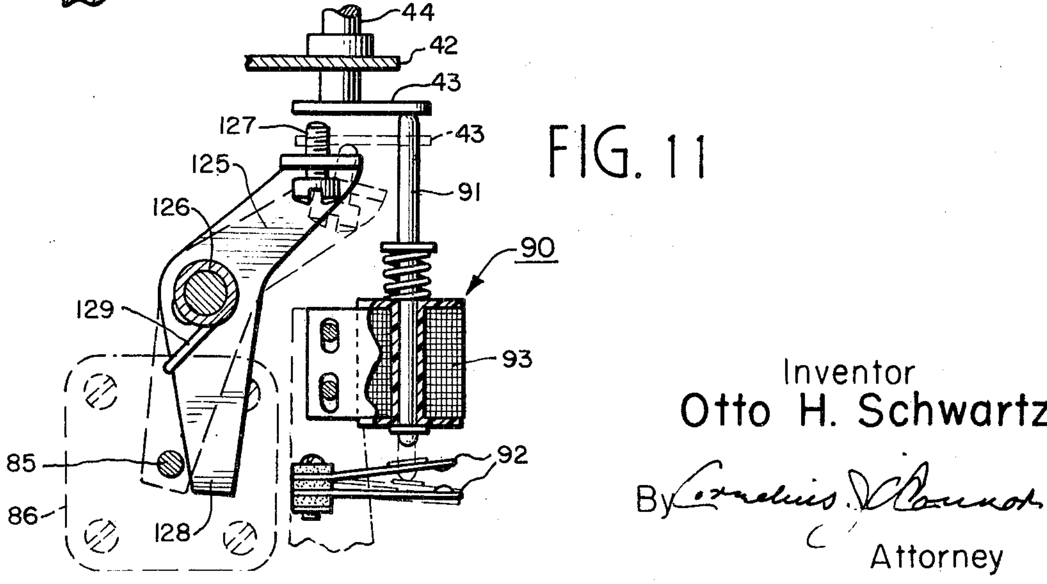
FIG. 11 is a sectional view taken along lines 11—11 of FIG. 2.

To achieve these ends a programming lever 125, which is pivotally secured within a bushing 126, is mounted on the rear face of support panel 20, see FIGS. 2 and 11. One end of lever 125 is provided with an adjustable stop 127 while the other end comprises a lip 128. A coil spring 129 serves to bias lever 125 to its normal position in which its stop 127 is positioned beneath flange 43 on the lower extremity of rack 44 and its lip 128 is disposed adjacent the axial path of motor armature 85. This position of lever 125 is depicted by solid line construction in FIG. 11. As previously noted holding relay 90 is mounted beneath UHF turret 27 with its plunger 91 also in the path of rack flange 43. Thus positioned, program lever 125 and relay plunger 91 are engageable by flange 43 at one extremity of the rack's travel.

Since the radial travel accorded each of turret cam lugs 39 by their respective spindles 32 is more than sufficient to enable it to tune UHF tuner 25 beyond its range, the innermost radial displacement of lug 39, and thus the vertical travel limit of rack 44, are resorted to for actuating program lever 125 and relay plunger 91. Accordingly, when a cam lug 39 is displaced to its innermost radial position it will, when engaged by follower 45, permit rack 44 to descend to the limit of its vertical travel at which point its flange 43 encounters relay plunger 91 and the stop 127 on program lever 125. When displaced by rack 44 lever 125 rotates to thrust lip 128 into the axial path of motor armature 85 to prevent armature pinion 84 from disengaging gear 82. At the same time rack flange 43 bears against relay plunger 91 to prevent contacts 92 from opening. These positions of the programming elements are depicted in FIG. 11 by broken-line construction.

In this arrangement it is necessary, of course, that flange 43 engage the program lever 125 and relay plunger 91 before toggle 97 is permitted to open carryover switch 96, since that would release relay 90 which, in turn, would de-energize the motor control circuit and permit the motor armature to disengage. To insure a prior actuation of lever 125 and relay plunger 91, stop 127 comprises a threaded shank that permits adjusting the point of contact between rack flange 43 and the stop. For the same reason relay 90 is adjustably supported adjacent flange 43, see FIG. 11.

It is also necessary, however, to insure that lever 125 and plunger 91 are not actuated when turret drum 29 is in the Park position. This is achieved by stud 49 which is radially positioned on drum 29 so as to arrest the vertical descent of rack 44 before it encounters lever 125 and relay plunger 91.

Operation

When activated, tuning system 10 serves to condition the television receiver for operation at a predetermined discrete channel in the VHF or UHF band. A sequence of channel selection operations will now be described commencing with the status of the tuning system as shown in FIG. 1. As there depicted UHF tuner 25 is conditioning the television receiver for operation on UHF channel 17. As previously mentioned VHF tuner 11 serves as an IF amplifier for the output of the UHF tuner when the latter is functioning as the channel selector. As best seen in FIG. 2, the angular orientation of UHF tuner control shaft 24, which determines the tuner's operating frequency, is established by the turret spindle 32 occupying the reference position. If it is desired to fine tune UHF channel 17, it is only necessary to depress control 35 to mate drive gear 34 with gear head 33 atop the referenced spindle 32. Rotation of control 35 is then communicated to tuner control shaft 24 through spindle 32, cam lug 39, cam follower 45, rack 44 and pinion 47. In like fashion, control 35 is employed to preselect UHF channels for each of the other spindles as they are presented to the reference position.

In the circumstance disclosed, that is, where the UHF tuner is the operative channel selector, the components of the actuating mechanism 50 assume the posture shown in FIG. 6. VHF geneva wheel 52 is in the standby position, therefore its cutout 55 occupies the index station. UHF geneva wheel 62, on the other hand, as the operative device presents one of its cam teeth 63U to the index station where it bears against shoe 121 of cam arm 120. The driving element 71 is in its quiescent position and tongue 100 of switch toggle 97 is seated in notch 72 of the driving element so that the carryover switch is likewise in its quiescent or off position, as shown in FIG. 10.

If it is desired to manually select a different preset UHF channel, for example, channel 26, knob 78 and control shaft 77 are rotated in a clockwise direction so that the elements of the gear train of actuating mechanism 50 rotate in the directions indicated by the arrows in FIG. 6. It is appreciated, of course that control 78 can be operated in a counterclockwise direction as well. At any rate the assumed clockwise displacement of control 78 is transferred through gears 76, 75 to rotate driving element 71 in a counterclockwise direction. As shown by the broken-line constructions in FIG. 5B, the base section 73U of the drive pin can enter a cam slot 64 of UHF geneva wheel 62 from either direction to effect a driving engagement with the geneva. However, insofar as the present operative description is concerned, drive pin section 73U enters an upper cam slot to rotate geneva 62 in a clockwise direction. Note in FIG. 6 that the drive pin section 73V can pass freely through cut-out 55 in stand-by VHF geneva 52 when UHF geneva 62 is the operative channel selector. Simultaneously, driving element 71 displaces switch toggle 97 from its off position in such a direction that its contact 98 establishes a conductive connection between fixed contacts 96C and 96R, in the manner illustrated by the broken-line construction in FIG. 10. Motor 86, however, remains inactive because relay 90 does not become energized during manual operation of the tuning system and, as a result, relay contacts 92 in the motor control circuit remain open.

As driving element 71 and drive pin 73U complete one orbit or revolution, geneva wheel 62 is rotated clockwise one step. This corresponds to a 30° angular displacement of wheel 62 and brings one of cam teeth 63I to the index station where it now encounters the shoe 121 of cam arm 120. Tooth 63I cams arm 120 in a counterclockwise direction which, in turn, carries lever 115 in the same direction to drive heel 117 of the lever against toggle pedestal 100 to hold the contact 98 of toggle 97 in engagement with contacts 96C and 96R. These positions of lever 115 and toggle 97 are shown in FIG. 8. While this switching action has no significance to a manual operation of the tuning system, the mechanics of the action are here presented to simplify a subsequent description of a motor actuated operation of the tuning system in which the switch toggle plays an important role.

The displacement of geneva 62 by drive pin 73U is transferred via gears 67 and 31 to turret control shaft 30 which rotates turret drum 29 one step counterclockwise from its previous operating position to one of its intermediate positions. As earlier noted the detent disc 36 for turret 29 has twelve indentations, six of which constitute channel selecting positions for the turret while six constitute intermediate positions which are interleaved with the former. It is appreciated, of course, that the drum could be converted to twelve channel selecting positions thus eliminating the intermediate positions. However, under the present state of development of the UHF broadcasting industry, there are few, if any, areas in which twelve UHF stations can be received. Therefore, the disclosed arrangement for turret 29 is simply a realistic embodiment capable of accommodating the present UHF station distribution in any one locale.

Insofar as the design of the UHF geneva is concerned, when the device employed for preselecting UHF channels has an even number of channel selectors, such as turret 29, then it is preferable that the total number of positions (as exemplified by the cam teeth plus the cut-out) for geneva 62 also be an even number. In the subject embodiment, therefore, the UHF geneva has one less position then the VHF geneva. On the other hand, it could have one more position than the VHF geneva so that the UHF turret and geneva would be fourteen position devices with seven operating and seven intermediate positions or fourteen operating positions. In any event the object is to avoid a wide divergency between the spacing of adjacent slots in the VHF geneva and the spacing between the spacing of adjacent slots in the VHF geneva and the spacing between adjacent slots in the UHF geneva since it is these spacings that determine the design of drive pin 73V, 73U.

Continuing, the next complete rotation of control 78 advances UHF geneva 62 another 30° to position a cam tooth 63U in registration with cam shoe 121 of arm 120. The profile of tooth 63U permits cam arm 120 and lever 115 to return to their quiescent positions which, in turn, allows carryover switch toggle 97 to return to its off position. With the advance of geneva 62, its drive gear 67 together with gear 31 advances turret 29 another step counterclockwise to register the next spindle cam lug 39 with cam follower 45. This registration effects a vertical relocation of rack 44 which, in turn, repositions UHF tuner control shaft 24 to condition the television receiver for operation on UHF channel 26. Disc 49, which advances with turret shaft 30, serves to identify the newly selected channel.

Thus with each complete revolution of driving element 71. UHF geneva 62 and turret 29 are stepped 30°. As geneva 62 is sequentially stepped through its positions, abutment 68 on the back face of gear 67 is also stepped along its path until it confronts abutment 58 on drive gear 67 which is connected to VHF geneva 52. At this juncture there is a 2.3° gap between the abutments which is, of course, the difference between the incremental displacements of genevas 62, 52 (30°−27.7°=2.3°), see FIG. 6. Cut-out portion 65 of geneva 62 is now presented to shoe 121 of cam arm 120 to permit arm 120, lever 115 and toggle 97 to return to their quiescent positions in the same manner as if one of teeth 63U was registered with cam shoe 121. Cut-out 65 thus performs the role of a UHF channel selector. On the next revolution of driving element 71, drive pin 73U again enters a cam slot 64 to advance geneva 62. However, there is no contact between abutments 58, 68 until geneva 62 advances 2.3°. Then both genevas advance one increment, the UHF geneva 30° and the VHF geneva 27.7°, as the driving element completes its revolution. Note that if the roles of the geneva were reversed at this juncture, so that the VHF geneva were to drive the UHF geneva, abutments 58, 68 are already in engagement and there would be no gap to be accounted for. Thus each time the UHF geneva, as the operative driving wheel, encounters the standby VHF geneva there will be a 2.3° gap between their respective abutments. On the other hand, when the VHF geneva, in the role as the operative driving wheel, encounters the standby UHF geneva there will be no gap between their respective abutments. Tooth 63P is now presented to cam shoe 121 so that arm 120, lever 115 and toggle 97 are again returned to their quiescent positions. Geneva 62, as well as UHF turret 29, have now assumed their standby or park positions. In this park position cam follower 45 and rack 44 descend until the follower is arrested by stud 49 thus preventing any possible engagement between rack flange 43 and program lever 125 and relay plunger 91. Simultaneously, VHF geneva 52 has been advanced to the operative position by virtue of the coupling afforded by UHF abutment 68 and VHF abutment 58. Thus, at the completion of this revolution of driving element 71, gap 65 of UHF geneva 62 and one of VHF cam teeth 53 are now registered with the index station.

With VHF tuner 11 now serving as the frequency selector for the television receiver a tuning strip responsive to channel 2, for example, has been positioned to control the VHF tuner and this condition is denoted by VMF indicator disc 17 in FIG. 4. More particularly, as VHF geneva 52 was displaced from its standby position to its operative position, its drive gear 57 advanced gear 16 one increment which, in turn, advanced VHF tuner control shaft 12 one step to position a tuning strip, the one tuned to VHF channel 2, into registration with the tuner's stator assembly to replace the strip which had been operating the VHF tuner as an IF amplifier for UHF tuner 25. As VHF geneva 52 advanced to the operative position programmer disc 110 also advanced one increment to position the program button designated Ch. 2 adjacent the foot 116 of cam lever 115. If the button 111 for channel 2 is retracted, as shown in FIG. 1, the foot 116 of cam lever 115 will return to its quiescent position.

To manually select the next VHF channel, control 78 is rotated clockwise which again effects a counterclockwise rotation of driving element 71. Driving element 71 now presents section 73V of the drive pin to VHF geneva slot 54. As drive pin section 73V completes one rotation, geneva 52 is rotated clockwise one position which corresponds to a 27.7° displacement of the geneva wheel. Drive pin section 73U simultaneously completes an unhindered orbit through UHF geneva cut-out 65. The construction of the drive pin sections and the arrangement of geneva cut-outs 55, 65 is such that only section 73V of the drive pin can engage the slots of VHF geneva 52 and only section 73U enters the slots of UHF geneva 62, see FIG. 5C.

Referring now to FIG. 8A, assume that the program button 111 shown extended is assigned to VHF channel 3. When so positioned, button 111 encounters and pivots lever 115 in a counterclockwise direction to drive the heel 117 of the lever into engagement with toggle pedestal 100, as shown in FIGURE 8, to maintain a conductive connection between two of the fixed contacts on carryover switch 96. This again, is of significance only when the tuning system is actuated by a motor drive. For manual operation, of course, carryover switch 96 has no function.

Accordingly, with each rotation of driving element 71, VHF geneva 52 is stepped one increment, 27.7°. This displacement is communicated to the VHF tuner control shaft 12 by gears 57 and 16 to advance the tuner one channel per geneva increment. In this fashion the VHF geneva 52 is stepped through its operating positions until the abutment 58 affixed to the side of gear 57 encounters UHF abutment 68. The next rotation of driving element 71 then advances geneva cut-out 55 to the index station thus relegating VHF geneva 52 to the standby position and the VHF tuner to its IF position. Simultaneously, UHF geneva 62 and turret 29 are transported 27.7° by VHF abutment 58 which, of course, is 2.3° short of their required 30° incremental advance. The additional 2.3° advance is provided, however, by the homing of detent mechanism 36, 37 on UHF turret drum 29. Geneva 62 and turret 29 now assume their operative positions. While this cycle of tuning system 10 has been described relative to a clockwise rotation of control 78, it is obvious that the tuning system can be operated in the reverse direction.

Prior to describing the operation of the tuning system by electric motor 86, the manner in which the previously described programming arrangements are set up will first be described. Let it first be assumed that there are but five UHF stations available in the vicinity so that it is desirable to bypass one of the operative positions of UHF turret 29. The turret is rotated by manual control 78 until the spindle 32 assigned to the position to be bypassed is in registration with control 35. Control 35 is then depressed and spindle 32 rotated until its cam lug 39 bottoms, that is, reaches the innermost limit of its radial travel. With cam lug 39 thus positioned cam follower 45 and rack 44 will descend to the limit of their vertical travel so that rack flange 43 can engage relay plunger 91 and the stop 127 on program lever 125. The position of stop 127, as well as the mounting position of relay 90, is a service adjustment which can be set to insure that the vertical travel of rack 44 is sufficient to actuate lever 125 and plunger 91. Thereafter, each time this particular spindle and its cam lug 39 are presented to cam follower 45, rack 44 will descend to actuate lever 125 to prevent the motor armature pinion 84 from disengaging from the gear train and, at the same time, hold relay contacts 92 closed.

To program the VHF stations, each of buttons 111 assigned to an available VHF station is rotated to its retracted position while the buttons associated with unavailable stations are rotated to their extended position so that they will encounter and pivot cam lever 115 when they are presented to the index station. Since the pivoted position of lever 115 holds the carryover switch closed, the motor circuit will remain energized and skip the unavailable channel.

Accordingly, to drive tuning system 10 with motor 86 the motor field windings are energized by closing one of switches 94L, 94R, either manually or by actuating one of the relays associated with the switches. Preferably, these relays are energized by a remote control system of the type shown and described in Adler Pat. 2,817,025. In any event, closure of switch 94R, for example, establishes a closed circuit from the upper terminal of the 120 volt source through the RIGHT field winding of motor 86, the contacts of switch 94R and the energizing coil 93 of relay 90 back to the lower terminal of the 120 volt source, see FIG. 10. Under the influence of its energized field winding armature 85 advances forwardly to effect an engagement between its pinion 84 and idler gear 85 of the actuating mechanism gear train. Driving element 31 is then driven in the direction indicated in FIG. 10 to pivot toggle 97 in a direction to permit toggle contact 98 to bridge carryover switch contacts 96C and 96R. This occurs almost instantly so that switch 94R need not be held closed for any appreciable length of time. The energizing circuit for the motor is now completed through the RIGHT field winding of motor 86, carryover switch contacts 96R, 96C, relay contacts 92 and the energizing coil 93 of the relay. The motor remains energized until driving element 71 returns to its quiescent position permitting the tongue 100 of switch pawl 97 to seat in notch 72 of the driving element. Seated thus pawl 97 opens the connection between contacts 96C and 96R to interrupt current flow through the energizing coil of relay 90 which, in turn, permits relay contacts 92 to open. For UHF operation, this would be the situation where one of geneva cam teeth 63U was advanced to the index position to permit cam arm 120 and lever 115 to pivot clockwise to their quiescent positions thereby enabling toggle 97 to return to its quiescent position.

On the other hand, when the UHF turret presents the spindle to the reference station for which no UHF station has been assigned, and therefore it is desirable that the turret rotate past this position to the next spindle, the mode of operation is as follows. When the aforementioned spindle registers in the reference station, cam lug 39 permits rack 44 to descend vertically until its flange 43 encounters stop 127 on program lever 125 and plunger 91 of relay 90. This engagement causes lever 125 to rotate clockwise, as viewed in FIG. 11, to insert its lip portion 128 behind armature shaft 85. Simultaneously, flange 43 holds relay plunger in to prevent contacts 92 from disengaging. When the UHF programming arrangement is thus actuated the only break in the motor energizing circuit occurs when toggle 97 permits the carryover switch 96 to momentarily open. However, since lever 125 prevents armature pinion 84 from disengaging from gear train idler 82, the inertia of the armature continues to rotate driving element 71 which, in turn, propels toggle 97 past its quiescent position to permit contact 98 to reestablish a conductive connection between switch contacts 96C and 96R. As the motor control circuit is now reenergized the motor drives UHF turret 27 to its next operating position via geneva 62 and the gear train apparatus of actuating mechanism 50.

The transfer between UHF operation and VHF operation is effected in the same manner as previously described for a manual actuation of the tuning system. The programming arrangement for VHF is determined by disc 110 and, more particularly, by buttons 111. For each of the available VHF stations in the vicinity the program button assigned thereto is rotated to its retracted position while the buttons for unavailable stations are rotated to their extended positions. It is clear from a study of FIG. 8 that each time an extended one of program buttons 111 encounters lever 115 it will pivot it counterclockwise to engage the pedestal 100 of toggle 97 and prevent the toggle from returning to its off position, thereby maintaining the motor control circuit energized. On the other hand, when presented to a retracted one of buttons 111, lever 115 is permitted to return to its quiescent position thus enabling toggle 97 to open the motor control circuit.

In summary the disclosed VHF–UHF system permits preselection of any television channel in the VHF and UHF bands, either manually or automatically through an actuating mechanism that sequentially steps the tuners through their respective tuning ranges.

While a particular embodiment of the invention has been shown and described, it will be obvious to those skilled in the art that changes and modifications may be made without departing from the invention in its broader aspects.

I claim:

1. A VHF–UHF tuning system for a television receiver comprising:

a VHF tuner having an incrementally positionable control shaft for tuning said VHF tuner to discrete channels in the VHF band;

a UHF tuner having an incrementally positionable control shaft for tuning said UHF tuner to a plurality of predetermined discrete channels in the UHF band;

an actuating mechanism for sequentially stepping said tuner control shafts through their respective tuning ranges comprising:

a VHF tuner drive unit comprising a geneva wheel coupled to and displaceable with said VHF tuner control shaft and having an assigned cam element for each of said VHF channels and a multilated portion interposed between two of said cam elements, a UHF tuner drive unit comprising a geneva wheel coupled to and displaceable with said UHF tuner control shaft and having an assigned cam element for each of said predetermined UHF channels and a mutilated portion interposed between two of said cam elements, means for rotatably mounting each of said geneva wheels adjacent an index station for displacement, alternately, from an operative position in which the cam elements of the wheel are sequentially presented to said index station to a stand-by position in which the mutilated portion of the wheel is in registration with said index station, drive means supported at said index station and movable through the mutilated portion of the stand-by geneva wheel for engaging the cam element presented to said index station by the operative geneva wheel to effect displacement of the tuner control shaft coupled to said operative wheel;

and means responsive to displacement of said operative wheel to said stand-by position for simultaneously transferring said stand-by wheel to said operative position.

2. A VHF–UHF tuning system as set forth in claim 1 in which said VHF cam elements comprise an array of substantially similar teeth having relieved portions therebetween and formed as integral radial extensions of said VHF geneva wheel.

3. A VHF–UHF tuning system as set forth in claim 2 in which said UHF cam elements comprise a first group of teeth and a second group of differently configurated teeth, all said teeth having relieved portions therebetween and formed as integarl radial extensions of said UHF geneva wheel.

4. A VHF–UHF tuning system as set forth in claim 3 in which said mutilated portion of said VHF geneva wheel has an arcuate dimension substantially equal to that of one of said VHF cam teeth plus two of said relieved portions in said VHF wheel and said mutilated portion of said UHF geneva wheel has an arcuate dimension substantially equal to that of one of said UHF cam teeth plus two of said relieved portions in said UHF wheel.

5. A VHF-UHF tuning system as set forth in claim 1 in which said means for mounting said VHF and said UHF geneva wheels includes a rotatably supported shaft for each of said geneva wheels.

6. A VHF-UHF tuning system as set forth in claim 5 in which said UHF geneva mounting shaft is coaxially journalled upon said VHF geneva shaft.

7. A VHF-UHF tuning system as set forth in claim 5 in which said drive means comprises a driving element supported for rotation about an axis parallel to said geneva mounting shafts and a drive pin eccentrically mounted on said driving element for rotation therewith, said drive pin having two sections, each individually engageable with the cam elements of an assigned one of said geneva wheels when said assigned geneva wheel is in the operative position and movable through said mutilated portion of said assigned geneva wheel when said assigned wheel is in the stand-by position.

8. A VHF–UHF tuning system as set forth in claim 7 in which the axis of one of said pin sections is offset from the axis of the other of said pin sections.

9. A VHF–UHF tuning system as set forth in claim 5 in which said VHF geneva wheel support shaft includes a pinion for coupling said VHF geneva wheel to said VHF tuner control shaft and said UHF geneva wheel support shaft includes a pinion for coupling said UHF geneva wheel to said UHF tuner control shaft.

10. A VHF-UHF tuning system as set forth in claim 9 in which said pinions are disposed in parallel confronting planes and in which said last recited means comprises a pair of projections individually extending from confronting surfaces of said pinions a distance such that their orbital paths overlap so as to limit displacement of each of said geneva wheels, relative to each other, to less than 360°.

11. A VHF-UHF tuning system as set forth in claim 10 in which each of said projections has an arcuate dimension substantially equal to the angular spacing between an adjacent pair of said VHF cam teeth.

12. A VHF-UHF tuning system as set forth in claim 1 in which said drive means includes an electric motor and an energizing circuit therefor and said tuning system further comprises programming means for controlling said motor energizing circuit to condition said television receiver for operation at programmed ones of said predetermined discrete channels in said VHF and said UHF bands.

13. A VHF-UHF tuning system as set forth in claim 12 in which said UHF cam elements comprise a first group of teeth and a second group of differently configurated teeth and in which the cam elements of one of said groups of UHF cam elements comprise an actuator for said programming means.

14. A VHF–UHF tuning system for a television receiver comprising:

a VHF tuner having a control shaft incrementally displaceable from a stand-by position through a plurality of VHF channel select operating positions;

a UHF tuner having a control shaft incrementally displaceable from a stand-by position through a plurality of UHF channel select operating positions;

a common drive means for said tuners having an operating cycle;

means for coupling said VHF tuner control shaft to said common drive means for advancing said VHF tuner shaft one increment in response to one operating cycle of said common drive means;

means for coupling said UHF tuner control shaft to said common drive means for advancing said UHF tuner shaft one increment in response to a plurality of consecutive operating cycles of said common drive means;

and means responsive to displacement of the operative one of said tuner shafts to its stand-by position for simultaneously transferring the stand-by one of said tuner shafts to an operating position.

15. A VHF–UHF tuning system as set forth in claim 14 for use with an electric drive motor, which system further includes:

means for connecting said common drive means to said motor;

and a motor energizing circuit responsive to said UHF tuner shaft coupling means for automatically effecting said plurality of consecutive operating cycles of said common drive means.

16. A VHF–UHF tuning system as set forth in claim 15 which further includes programming means for controlling said motor energizing circuit to displace said UHF tuner shaft from one channel select position to a predetermined different channel select position.

References Cited

UNITED STATES PATENTS

| | | | |
|---|---|---|---|
| 3,179,907 | 4/1965 | Brand et al. | 334—1 |
| 3,196,695 | 7/1965 | Dotto | 334—1 X |
| 3,234,490 | 2/1966 | Dickinson et al. | 334—2 |
| 3,241,072 | 3/1966 | Brand | 334—1 X |
| 3,248,953 | 5/1966 | Holper et al. | 74—436 |
| 3,327,221 | 6/1967 | Reith | 334—2 X |

HERMAN K. SAALBACH, Primary Examiner

P. L. GENSLER, Assistant Examiner

U.S. Cl. X.R.

74—10.45, 436; 334—29.88